(12) United States Patent
Srivastava et al.

(10) Patent No.: US 9,182,767 B2
(45) Date of Patent: Nov. 10, 2015

(54) DEVICES AND METHODS FOR CALIBRATING AND OPERATING A SNAPBACK CLAMP CIRCUIT

(71) Applicant: QUALCOMM Incorporated, San Diego, CA (US)

(72) Inventors: Ankit Srivastava, San Diego, CA (US); Matthew David Sienko, San Diego, CA (US); Eugene Robert Worley, Irvine, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 150 days.

(21) Appl. No.: 13/794,268

(22) Filed: Mar. 11, 2013

(65) Prior Publication Data
US 2014/0254051 A1    Sep. 11, 2014

(51) Int. Cl.
| | | |
|---|---|---|
| *H02H 9/00* | (2006.01) | |
| *G05F 1/10* | (2006.01) | |
| *H01L 27/02* | (2006.01) | |
| *H01L 27/06* | (2006.01) | |
| *H02H 9/04* | (2006.01) | |
| *H02H 3/00* | (2006.01) | |

(52) U.S. Cl.
CPC ............ *G05F 1/10* (2013.01); *H01L 27/0274* (2013.01); *H01L 27/0277* (2013.01); *H01L 27/0629* (2013.01); *H02H 9/041* (2013.01); *H02H 9/046* (2013.01); *H02H 3/006* (2013.01)

(58) Field of Classification Search
CPC ...................................................... H02H 9/04
USPC .......................................................... 361/56
See application file for complete search history.

(56) References Cited

U.S. PATENT DOCUMENTS

| | | | |
|---|---|---|---|
| 4,853,646 A | * | 8/1989 | Johnson et al. ............... 330/256 |
| 5,189,322 A | * | 2/1993 | Chan et al. ..................... 327/54 |
| 5,369,317 A | | 11/1994 | Casper et al. |

(Continued)

FOREIGN PATENT DOCUMENTS

| | | |
|---|---|---|
| JP | H1141801 A | 2/1999 |
| JP | 2000209085 A | 7/2000 |
| WO | WO-2010030968 A2 | 3/2010 |

OTHER PUBLICATIONS

DeHeyn, et al., "Design and analysis of new protection structures for smart power technology with controlled trigger and holding voltage," IEEE International Reliability Physics Symposium, Proceedings, pp. 253-258, 2001.

(Continued)

*Primary Examiner* — Thienvu Tran
*Assistant Examiner* — Tien Mai
(74) *Attorney, Agent, or Firm* — Patterson & Sheridan, LLP

(57) ABSTRACT

A device includes a snapback clamp circuit configured to clamp a supply voltage in response to the supply voltage exceeding a trigger voltage level. In at least one embodiment, the snapback clamp circuit includes a clamp transistor and a programmable resistance portion that is responsive to a control signal to calibrate the trigger voltage level. Alternatively or in addition, the snapback clamp circuit may include a programmable bias device configured to calibrate the trigger voltage level by biasing a gate terminal of the clamp transistor. In another particular embodiment, a method of calibrating a snapback clamp circuit is disclosed. In another particular embodiment, a method of operating an integrated circuit is disclosed.

47 Claims, 10 Drawing Sheets

(56) References Cited

U.S. PATENT DOCUMENTS

| | | |
|---|---|---|
| 6,430,016 B1 | 8/2002 | Marr |
| 6,946,707 B2 | 9/2005 | Voldman |
| 7,312,513 B1 | 12/2007 | Wilcox |
| 7,660,086 B2 * | 2/2010 | Rodgers et al. ............ 361/56 |
| 8,102,002 B2 | 1/2012 | Foley et al. |
| 8,335,064 B2 | 12/2012 | Soldner et al. |
| 8,395,435 B2 | 3/2013 | Cassia et al. |
| 2002/0014904 A1 | 2/2002 | Morishita |
| 2002/0045995 A1 * | 4/2002 | Shimazaki et al. ........ 702/77 |
| 2004/0141267 A1 | 7/2004 | Khazhinsky et al. |
| 2005/0030688 A1 | 2/2005 | Sakihama et al. |
| 2005/0225912 A1 | 10/2005 | Pant et al. |
| 2008/0088994 A1 | 4/2008 | Lai |
| 2012/0081823 A1 | 4/2012 | Chu |
| 2012/0154962 A1 | 6/2012 | Russ et al. |
| 2012/0236448 A1 | 9/2012 | Hiraoka |

OTHER PUBLICATIONS

Wang A.Z.H., et al., "On a Dual-Polarity On-Chip Electrostatic Discharge Protection Structure," IEEE Transactions on Electron Devices, vol. 48, No. 5, pp. 978-984, May 2001.

International Search Report and Written Opinion—PCT/US2014/021069—ISA/EPO—Jun. 4, 2014.

* cited by examiner

DEVICES AND METHODS FOR CALIBRATING AND OPERATING A SNAPBACK CLAMP CIRCUIT

I. FIELD

The present disclosure is generally related to electronic devices and more particularly to electronic devices that include snapback clamp circuits.

II. DESCRIPTION OF RELATED ART

Advances in technology have resulted in smaller and more powerful electronic devices. For example, there currently exist a variety of portable electronic devices, including portable wireless telephones, personal digital assistants (PDAs), and paging devices, which may be small, lightweight, and easily carried by users. Certain electronic devices, such as cellular telephones and wireless Internet Protocol (IP) telephones, can communicate voice and data packets over wireless networks. Further, many such electronic devices include other types of devices that are incorporated therein. For example, a wireless telephone can also include a digital still camera, a digital video camera, a digital recorder, and an audio file player. Also, wireless telephones can process executable instructions, including software applications, such as a web browser application, that can be used to access the Internet. As such, wireless telephones and other electronic devices can include significant computing capabilities, which may be implemented using integrated circuits.

Fluctuations in a supply voltage associated with an electronic device may damage or alter operation of the electronic device. For example, "glitches" associated with the supply voltage may cause "spikes" in the supply voltage, which may potentially damage components of the electronic device, such as an integrated circuit. As another example, electrostatic discharge (ESD) may occur due to transfer of charge from an object or a person to the electronic device. ESD can severely alter operation of the integrated circuit or cause damage to the integrated circuit (e.g., by damaging gate oxide layers of transistors of the integrated circuit), thereby damaging the electronic device that utilizes the integrated circuit.

III. SUMMARY

Certain devices may utilize a clamp circuit to maintain a supply voltage within a particular operating range by "clamping" the supply voltage in response to the supply voltage exceeding a trigger voltage level. For example, a field effect transistor (FET) clamp circuit, such as a "big FET" clamp circuit, may become conductive and may dissipate current in response to the supply voltage exceeding a trigger voltage level. However, big FET clamp circuits may be associated with a slow response time and therefore may not be suitable for supply glitch protection in certain applications. As another example of a clamp circuit, a "snapback" clamp circuit may utilize a parasitic bipolar junction transistor (BJT) effect associated with a FET to dissipate current in response to the supply voltage exceeding a trigger voltage level associated with the snapback clamp circuit. The snapback clamp circuit may not be suitable for electrostatic discharge (ESD) protection in some applications, since certain circuit components may not be designed to withstand a relatively large holding voltage associated with the snapback clamp circuit (e.g., a voltage to which the snapback clamp circuit "snaps back" during clamping operation).

A snapback clamp circuit in accordance with at least one embodiment of the present disclosure includes a snapback clamp circuit having a trigger voltage level that may be calibrated. Operation of the snapback clamp circuit may advantageously incorporate a fast response time associated with snapback clamp circuits while clamping in response to a trigger voltage level that can be calibrated (e.g., lowered) to within a suitable range (e.g., low enough to not damage certain circuit components during ESD events), thus enabling both supply glitch suppression and ESD protection. For example, the trigger voltage level may be calibrated based on a selected body-to-ground resistance associated with the snapback clamp circuit, based on a gate-to-source voltage applied at the snapback clamp circuit, or a combination thereof. In a particular illustrative embodiment, the snapback clamp circuit is included within an integrated circuit and the trigger voltage level is calibrated based on supply glitches caused by off-chip trace inductances associated with a supply voltage that supplies the integrated circuit (or a portion thereof), as explained further below.

To illustrate, a device may include an integrated circuit having a class-D amplifier that drives a speaker. The class-D amplifier may be configured to generate a high-frequency square wave signal (e.g., a 600 kilohertz (kHz) square wave signal that encodes an audio signal). The class-D amplifier may be "switched" on and off quickly to generate the square wave signal. Faster switching may be associated with better performance (e.g., better signal resolution, less harmonic distortion, or a combination thereof). However, rapidly switching transistors on and off to generate the high-frequency square wave signal may cause spikes or "glitches" in the amplifier power supply, such as by causing off-chip trace inductances to output a voltage in response to changes in the amount of current drawn by the class-D amplifier. The supply voltage glitches can cause soft damage (e.g., decreased performance, such as increased harmonic distortion) or hard damage (e.g., hardware damage, such as damage to low-power components not designed to operate in connection with supply glitches) to the device. In at least one embodiment, a programmable snapback clamp circuit may be calibrated (e.g., by calibrating a trigger voltage level of the snapback clamp circuit) based on the trace inductances to suppress the glitches in the amplifier power supply, as explained further below.

In a particular embodiment, a device includes a snapback clamp circuit configured to clamp a supply voltage in response to the supply voltage exceeding a trigger voltage level. The snapback clamp circuit includes a clamp transistor and a programmable resistance portion. The programmable resistance portion is responsive to a control signal to calibrate the trigger voltage level.

In another particular embodiment, a device includes a snapback clamp circuit configured to clamp a supply voltage in response to the supply voltage exceeding a trigger voltage level. The snapback clamp circuit includes a clamp transistor and a programmable bias device. The programmable bias device is configured to calibrate the trigger voltage level by biasing a gate terminal of the clamp transistor.

In another particular embodiment, a method of calibrating a snapback clamp circuit is disclosed. The method includes calibrating a trigger voltage level associated with the snapback clamp circuit by modifying a body-to-ground resistance associated with a clamp transistor via a control signal and biasing a gate terminal of the clamp transistor based on a programmable bias device to further calibrate the trigger voltage level.

In another particular embodiment, an apparatus includes means for clamping a supply voltage based on a trigger voltage level. The apparatus further includes means for calibrating the trigger voltage level. The means for calibrating the trigger voltage level includes means for biasing an input node of the means for clamping the supply voltage and means for modifying a body-to-ground resistance associated with the means for clamping the supply voltage.

In another particular embodiment, a non-transitory computer-readable medium stores instructions executable by a processor. The instructions are executable by the processor to calibrate a trigger voltage level of a snapback clamp circuit by generating a control signal to calibrate a programmable resistance portion of the snapback clamp circuit.

In another particular embodiment, an integrated circuit includes a snapback clamp circuit having a trigger voltage level. The trigger voltage level is determined based on a programmed bias device of the snapback clamp circuit, a programmed body-to-ground resistance of the snapback clamp circuit, or a combination thereof, The snapback clamp circuit is configured to clamp a supply voltage in response to the supply voltage exceeding the trigger voltage level during an electrostatic discharge (ESD) event. The snapback clamp circuit enables glitch-suppression and ESD protection of the integrated circuit.

In another particular embodiment, a method of operating an integrated circuit is disclosed. The method includes, in response to a supply voltage exceeding a trigger voltage level during an electrostatic discharge (ESD) event, clamping the supply voltage by a snapback clamp circuit of the integrated circuit. The trigger voltage level is determined responsive to a programmed bias device of the snapback clamp circuit, a programmed body-to-ground resistance of the snapback clamp circuit, or a combination thereof. The snapback clamp circuit enables glitch suppression and ESD protection of the integrated circuit.

One particular advantage provided by at least one of the disclosed embodiments is that supply voltage glitch suppression and electrostatic discharge (ESD) protection may be calibrated based on the particular application. For example, as explained further below, a trigger voltage level of a snapback clamp circuit may be calibrated based on trace inductances associated with an off-chip portion coupled to an integrated circuit that includes the snapback clamp circuit. Accordingly, the trigger voltage level may be calibrated after fabrication of the integrated circuit instead of separately pre-calibrating the trigger voltage level for each application or pre-calibrating a single trigger voltage level for a variety of applications. In addition, as explained further below, the trigger voltage level may be calibrated to enable the snapback clamp both to suppress supply voltage glitches and to protect circuitry against ESD events. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
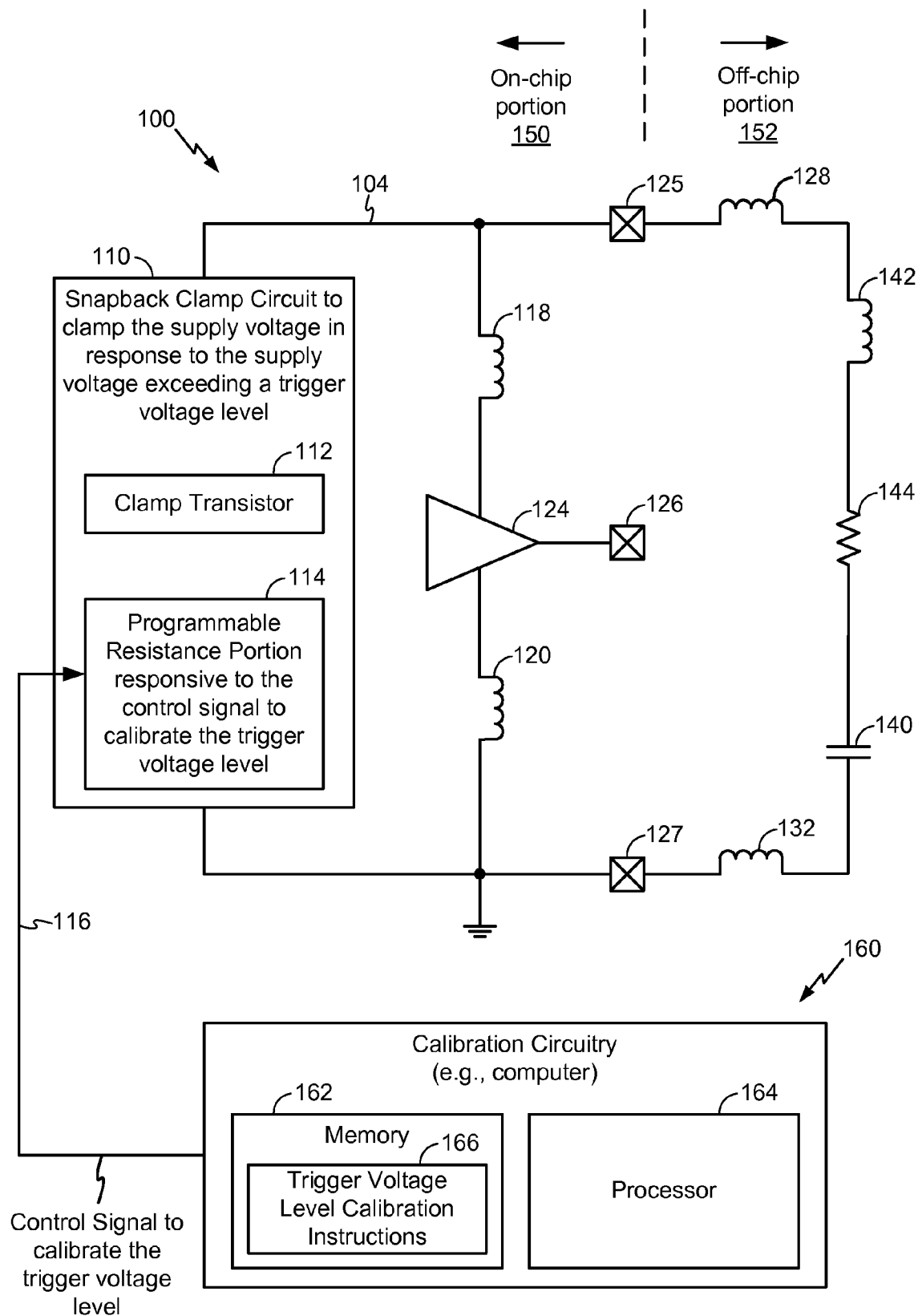
FIG. 1 is a diagram of a system that includes a device having a snapback clamp circuit responsive to a control signal to calibrate a trigger voltage level of the snapback clamp circuit.

FIG. 1 depicts a particular illustrative embodiment of a system that includes a device 100 and calibration circuitry 160 (e.g., a computer). The calibration circuitry 160 includes a memory 162 (e.g., a computer-readable memory) coupled to a processor 164. The memory 162 may store trigger voltage level calibration instructions 166 executable by the processor 164 to generate a control signal 116, as explained further below. As used herein, a memory, such as the memory 162, may include a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, or any other form of non-transitory storage medium.

The device 100 may include an on-chip portion 150 (e.g., an integrated circuit) and an off-chip portion 152 (e.g., power supply circuitry associated with the device 100). The on-chip portion 150 includes a snapback clamp circuit 110. The snapback clamp circuit 110 of FIG. 1 includes a clamp transistor 112 and a programmable resistance portion 114. As described further below, the programmable resistance portion 114 may include components that may be calibrated to modify a body-to-ground resistance associated with the clamp transistor 112. Alternatively or in addition to the programmable resistance portion 114, the snapback clamp circuit 110 may include one or more programmable bias devices to bias the clamp transistor 112, as explained further below.

The snapback clamp circuit 110 is responsive to a supply voltage 104 (e.g., a supply voltage having a direct current (DC) voltage of approximately 5.5 volts). The snapback clamp circuit 110 may be associated with a "trigger voltage level." For example, in response to a magnitude of the supply voltage 104 exceeding the trigger voltage level, the clamp transistor 112 may begin to "clamp" (e.g., restrict) the supply voltage 104 by shunting current to ground via a body terminal of the clamp transistor 112 until the magnitude of the supply voltage 104 is lowered to a "holding" voltage, as described further below in connection with operation of the snapback clamp circuit 110.

The on-chip portion 150 may further include one or more additional components powered by the supply voltage 104. In a particular embodiment, the on-chip portion 150 further includes a load 124 powered by the supply voltage 104. The on-chip portion 150 may be associated with trace inductances (e.g., parasitic inductances due to physical circuit characteristics, such as a length of a conductive channel), illustrated in FIG. 1 as on-chip trace inductances 118, 120.

The off-chip portion 152 may include circuitry to generate the supply voltage 104, such as a decoupling capacitor 140 (e.g., a capacitor to filter particular frequencies of the supply voltage 104). The decoupling capacitor 140 may be associated with an equivalent series inductance (ESL) and an equivalent series resistance (ESR), illustratively depicted in FIG. 1 as an ESL 142 and an ESR 144, respectively. The off-chip portion 152 may be associated with additional trace inductances, illustratively depicted in FIG. 1 as off-chip trace inductances 128, 132. The off-chip portion 152 may be coupled to the on-chip portion 150 via one or more input/output (I/O) components (e.g., pins), such as I/O components 125, 126, 127 depicted in FIG. 1. The snapback clamp circuit 110 may be responsive to the control signal 116 via an I/O component, such as a serial bus (not shown in FIG. 1).

In operation, such as during calibration of the snapback clamp circuit 110, the processor 164 may execute the trigger voltage level calibration instructions 166 to generate a control signal 116 to calibrate the trigger voltage level associated with the snapback clamp circuit 110. For example, the processor 164 may execute the trigger voltage level calibration instructions 166 to generate the control signal 116 to calibrate the trigger voltage level, such as by modifying a body-to-ground resistance associated with the clamp transistor 112, as described further below.

Because the programmable resistance portion 114 is responsive to the control signal 116, the trigger voltage level may be calibrated at least in part to compensate for one or more of the trace inductances 118, 120, 128, 132. For example, because the snapback clamp circuit 110 may be calibrated after the on-chip portion 150 is coupled to the off-chip portion 152, the snapback clamp circuit 110 may be programmable to account for off-chip parasitic trace inductances, such as the off-chip trace inductances 128, 132 that may cause "glitches" in the supply voltage 104 (e.g., by outputting current in response to fluctuations in the supply voltage 104) and that are known only after coupling the on-chip portion 150 to the off-chip portion 152 (e.g., due to process variations associated with the on-chip portion 150, the off-chip portion 152, or a combination thereof). In a particular example, values of the supply voltage 104 may be observed during operation of the device 100 to detect supply glitches associated with the supply voltage 104 and therefore a magnitude of the trace inductances 118, 120, 128, 132. The trigger voltage level may be adjusted to compensate for the supply glitches. Accordingly, the trigger voltage level advantageously may be calibrated based on a magnitude of the off-chip trace inductances 128, 132 (e.g., by adjusting the trigger voltage level calibration instructions 166 so that the control signal 116 calibrates the trigger voltage level based on the magnitude of one or more of the trace inductances 118, 120, 128, 132). In addition, after the trigger voltage level has been determined, the memory 162 may store data corresponding to the trigger voltage level. The data may be accessed by the calibration circuitry 160 to calibrate further devices (not shown in FIG. 1) in addition to the device 100.

To further illustrate, it should be noted that a location of the decoupling capacitor 140 (e.g., a position of the decoupling capacitor 140 relative to the remainder of the off-chip portion 152) may affect inductance values of the off-chip trace inductances 128, 132. For example, positioning the decoupling capacitor 140 relatively close to the on-chip portion 150 may reduce supply glitches caused by the off-chip trace inductances 128, 132. However, the location of the decoupling capacitor 140 may be constrained by design specifications (e.g., a layout of the off-chip portion 152, which may be determined by other components that are to be positioned between the decoupling capacitor 140 and the on-chip portion 150). Accordingly, in at least one embodiment, calibration of the device 100 using the snapback clamp circuit 110 may enable dynamic (e.g., "post-assembly" or "in the field") calibration based on trace inductances (e.g., the off-chip trace inductances 128, 132) that are determined based on the location of the decoupling capacitor 140, such as after a "tape out" manufacturing phase of an integrated circuit that includes the on-chip portion 150, after connecting the on-chip portion 150 to the off-chip portion 152, after integration of the device 100 with a printed circuit board (PCB), or a combination thereof.

As used herein, "calibration" and "programming" may refer to non-volatile memory storage and/or one-time programming of circuitry, such as using one-time programmable (OTP) logic (e.g., via the control signal 116), which may occur during device manufacturing. "Calibration" and "programming" as used herein may also indicate that a control signal, such as the control signal 116, is asserted during device operation (e.g., via a pin of an integrated circuit, or via another device component) to enable "dynamic" calibration. Particular calibration examples are described further below.

Figure 2:
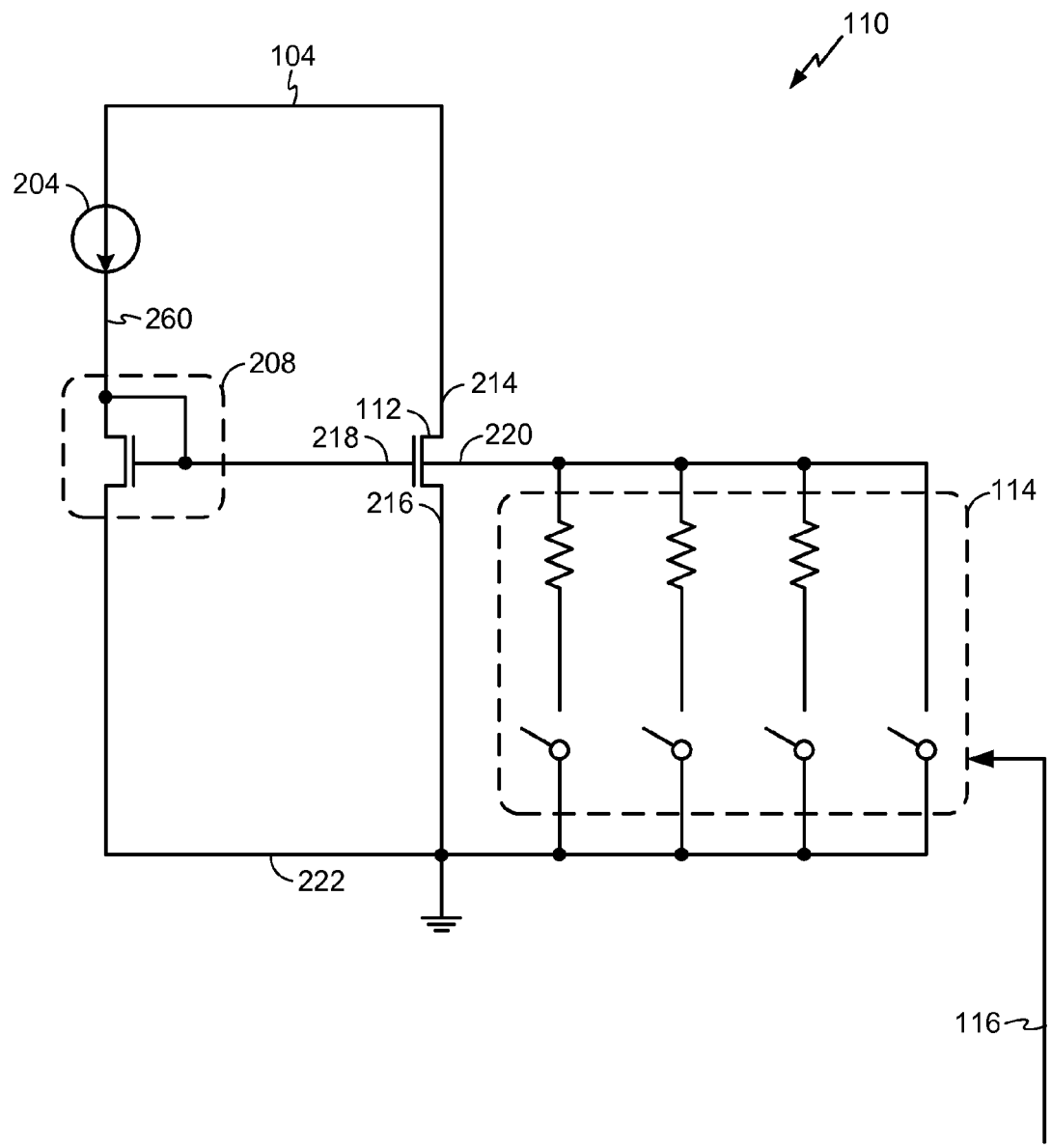
FIG. 2 is a diagram of a particular illustrative embodiment of the snapback clamp circuit of FIG. 1.

FIG. 2 depicts a particular illustrative embodiment of the snapback clamp circuit 110 of FIG. 1. Certain components and operations of the snapback clamp circuit 110 of FIG. 2 may be as described with reference to FIG. 1. For example, the snapback clamp circuit 110 of FIG. 2 is responsive to the supply voltage 104 and includes the clamp transistor 112. The clamp transistor 112 is coupled to the programmable resistance portion 114. The programmable resistance portion 114 is responsive to a control signal, such as the control signal 116.

In the particular example of FIG. 2, the snapback clamp circuit 110 further includes a current source 204 configured to generate a current 260, a diode device 208 (e.g., a diode-configured transistor) responsive to the current 260, and a ground node 222. As shown in FIG. 2, the clamp transistor 112 may include a drain terminal 214, a source terminal 216, a gate terminal 218, and a body terminal 220. The body terminal 220 may be selectively coupled to the ground node 222 via the programmable resistance portion 114, as explained further below. The gate terminal 218 is coupled to the diode device 208. The drain terminal 214 is responsive to the supply voltage 104. The source terminal 216 is coupled to the ground node 222.

In the example of FIG. 2, the programmable resistance portion 114 includes a plurality of resistors and a corresponding plurality of switches (e.g., transistors) as illustrated. The plurality of resistors of the programmable resistance portion 114 is coupled to the body terminal 220 of the clamp transistor 112. A first resistor of the plurality of resistors is coupled to a first switch and a second resistor of the plurality of resistors is coupled to a second switch. In addition, a third resistor of the plurality of resistors is coupled to a third switch as shown. Although three resistors and three corresponding switches are shown, it should be understood that more than three or fewer than three resistors and switches may be included in the programmable resistance portion 114.

The programmable resistance portion 114 may further include a low-resistance path (e.g., a "short-to-ground" path) that is coupled to a fourth switch as shown. The fourth switch may be enabled in order to create a "short" circuit path from the body terminal 220 to the ground node 222. The fourth switch may be disabled to "open" the low-resistance path (i.e., the low-resistance path may be disabled when the fourth switch is disabled). Thus, the low-resistance path may be used to change a resistance of the programmable resistance portion 114.

In operation, the programmable resistance portion 114 is responsive to the control signal 116. For example, responsive to the control signal 116, one or more of the switches of the programmable resistance portion 114 may be selected. Each switch that is selected enables an increase in resistance associated with the programmable resistance portion 114 or a decrease of the resistance of the programmable resistance portion 114 based on a particular resistor corresponding to the switch. For example, enabling the first switch switches in the first resistor to connect the first resistor to the body terminal 220 and to the ground node 222. Similarly, the control signal 116 may select the second switch to connect the second resistor between the body terminal 220 and the ground node 222. Similarly, the third switch may be selected to switchably connect the third resistor between the body terminal 220 and the ground node 222. Accordingly, one or more of the resistors may be selectively connected between the body terminal 220 and the ground node 222. Thus, the programmable portion 114 has a body-to-ground resistance between the body terminal 220 and the ground node 222 that may be calibrated (i.e., programmed) to one or more resistance levels. Selection of the particular resistance values of each of the plurality of resistors, the number of resistors in parallel, and the particular arrangement of switches that are enabled or disabled may be combined in order to select a particular body-to-ground resistance.

Based on the selected resistance of the programmable resistance portion 114, a particular trigger voltage may be calibrated for the clamp transistor 112. That is, because the body-to-ground resistance of the programmable resistance portion 114 affects the trigger voltage level of the clamp transistor 112 (e.g., by determining how much current may be dissipated from the body terminal 220 to the ground node 222 during parasitic bipolar operation of the clamp transistor 112), calibrating or programming the body-to-ground resistance of the programmable resistance portion 114 may change the trigger voltage level associated with the clamp transistor 112.

Calibrating the trigger voltage level of the clamp transistor 112 as described with reference to FIG. 2 may enable both supply glitch suppression and ESD protection while avoiding setting the trigger voltage level "too low" or "too high." For example, since clamping circuits typically operate by dissipating current and therefore consume energy, calibrating the trigger voltage level to a particular level may provide a trigger voltage level that is low enough to protect against ESD events while high enough to not trigger excessively and therefore consume a large amount of energy. Therefore, reliability and efficiency of the snapback clamp circuit 110 may be adjusted. Further, because parasitic bipolar operation associated with the clamp transistor 112 (described further with reference to FIG. 9) begins relatively quickly in response to supply glitches, such as within 20-30 picoseconds (ps), the snapback clamp circuit 110 of FIG. 2 may advantageously protect against ESD events as well as supply glitches.

Alternatively or in addition to the programmable resistance portion 114, the trigger voltage level may be determined or adjusted based on a gate-to-source voltage applied at the clamp transistor 112. The gate-to-source voltage of the clamp transistor 112 may be biased by a programmable bias device, as described further below, such as with reference to FIG. 3.

Figure 3:
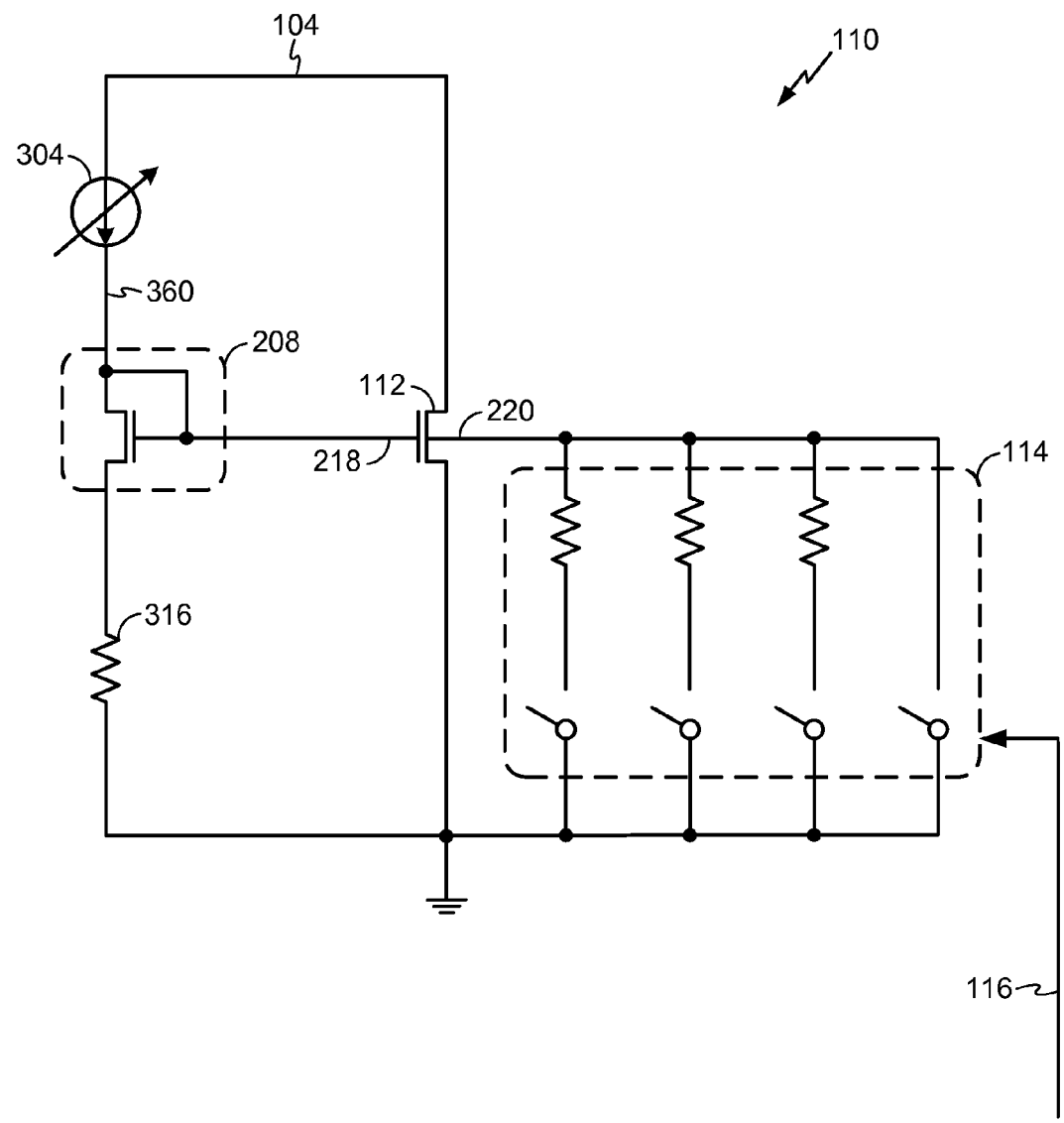
FIG. 3 is a diagram of another particular illustrative embodiment of the snapback clamp circuit of FIG. 1.

FIG. 3 depicts another particular illustrative embodiment of the snapback clamp circuit 110 of FIG. 1. Certain components and operations of the snapback clamp circuit 110 of FIG. 3 may be as described with reference to FIGS. 1 and 2. For example, the clamp transistor 112 of FIG. 3 is responsive to the supply voltage 104. The clamp transistor 112 includes the gate terminal 218 and the body terminal 220. The programmable resistance portion 114 is responsive to the control signal 116 and to the diode device 208.

In addition, in the particular example of FIG. 3, the snapback clamp circuit 110 includes a programmable bias device. In the example of FIG. 3, the programmable bias device includes a programmable current source 304 (e.g., a variable current source) configured to generate a current 360 (e.g., a current that can be calibrated by controlling the programmable current source 304). As described herein, a programmable bias device may be responsive to one or more control signals, such as the control signal 116, another control signal, or a combination thereof. The snapback clamp circuit 110 of FIG. 3 may further include a resistor 316 coupled to the diode device 208.

In operation, the programmable current source 304 may bias the diode device 208 via the current 360. The diode device 208 may bias the gate terminal 218 of the clamp transistor 112 in response to the current 360. Because bias conditions (e.g., a gate-to-source voltage) at the gate terminal 218 of the clamp transistor 112 affect the trigger voltage level associated with the clamp transistor 112, the programmable current source 304 may be programmed to calibrate the trigger voltage level.

Accordingly, a magnitude of the current 360 may be programmed to bias the gate terminal 218 according to a particular gate-to-source voltage in order to calibrate the trigger voltage level. In addition, the trigger voltage level can be further calibrated by programming the body-to-ground resistance associated with the programmable resistance portion 114. In at least one embodiment, by increasing the gate-to-source voltage of the clamp transistor 112 while increasing the body-to-ground resistance associated with the programmable resistance portion 114, the trigger voltage level can be lowered such that ESD events may be dissipated by the snapback clamp circuit 110.

It should be appreciated that the programmable bias device and the programmable resistance portion 114 may be separately controllable—for example, depending on the particular application, one or both of the programmable bias device and the programmable resistance portion 114 may be utilized to calibrate the snapback clamp circuit 110. In a particular illustrative embodiment, one of the programmable bias device and the programmable resistance portion 114 is used as a "coarse" adjustment of the trigger voltage level and the other of the programmable bias device and the programmable resistance portion 114 is used as a "fine" adjustment of the trigger voltage level. Therefore, the particular example of FIG. 3 may enable further calibration of the trigger voltage level of the snapback clamp circuit 110, such as via "coarse" and "fine" adjustment.

Figure 4:
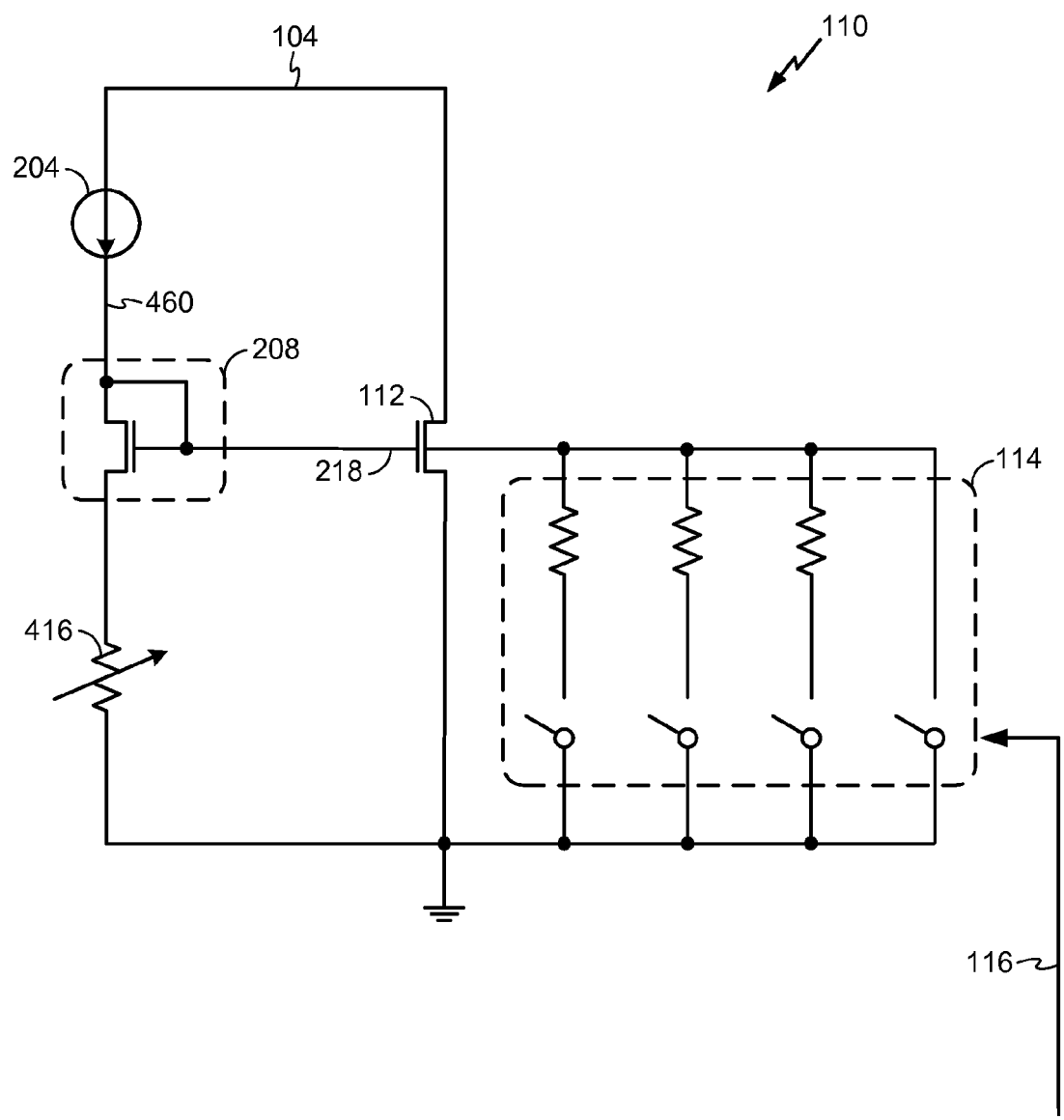
FIG. 4 is a diagram of another particular illustrative embodiment of the snapback clamp circuit of FIG. 1.

FIG. 4 depicts another particular illustrative embodiment of the snapback clamp circuit 110 of FIG. 1. Certain components and operations of the snapback clamp circuit 110 of FIG. 4 may be as described with reference to FIGS. 1-3. For example, the snapback clamp circuit 110 of FIG. 4 is responsive to the supply voltage 104 and includes the clamp transistor 112, the diode device 208, the current source 204, and the programmable resistance portion 114 responsive to the control signal 116. The clamp transistor 112 includes the gate terminal 218.

In addition, in the particular example of FIG. 4, the snapback clamp circuit 110 includes a programmable bias device. In the example of FIG. 4, the programmable bias device includes a programmable resistor 416 (e.g., a resistor having a resistance that can be changed, such as a variable resistor).

In operation, the current source 204 may bias the diode device 208 by generating a current 460. The diode device 208 may bias the gate terminal 218 of the clamp transistor 112 in response to the current 460. For example, based on a selected resistance value of the programmable resistor 416, a bias current with which the diode device 208 biases the gate terminal 218 may be determined or adjusted. Accordingly, the gate terminal 218 of the clamp transistor 112 may be biased based on the selected resistance value of the programmable resistor 416.

Because bias conditions at the gate terminal 218 affect the trigger voltage level associated with the clamp transistor 112, selection of the resistance value of the programmable resistor 416 may advantageously enable calibration of the snapback operation of the snapback clamp circuit 110. In at least one embodiment, the trigger voltage level may be calibrated to account for process variations, such as variations in resistivity of a substrate used to form the snapback clamp circuit 110, as described further with reference to FIG. 8.

Figure 5:
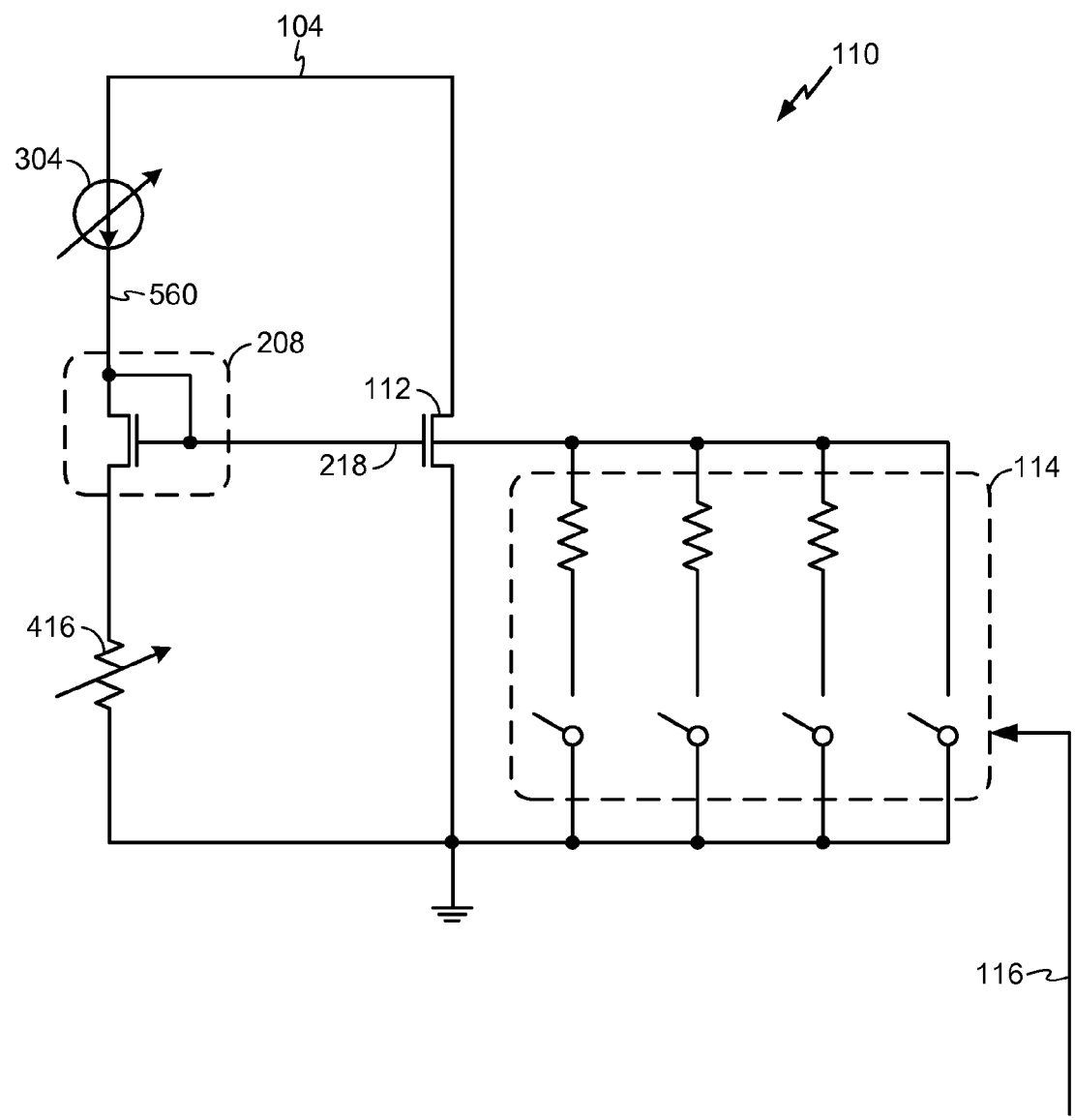
FIG. 5 is a diagram of another particular illustrative embodiment of the snapback clamp circuit of FIG. 1.

FIG. 5 depicts another particular illustrative embodiment of the snapback clamp circuit 110 of FIG. 1. Certain components and operations of the snapback clamp circuit 110 of FIG. 5 may be as described with reference to FIGS. 1-4. For example, the snapback clamp circuit 110 of FIG. 5 is responsive to the supply voltage 104 and includes the clamp transistor 112, the programmable current source 304, the diode device 208, the programmable resistor 416, and the programmable resistance portion 114 responsive to the control signal 116. The clamp transistor 112 includes the gate terminal 218.

In addition, in the particular example of FIG. 5, the snapback clamp circuit 110 includes a programmable bias device. The programmable bias device of FIG. 5 includes the programmable current source 304 and the programmable resistor 416.

In operation, each of the programmable current source 304 and the programmable resistor 416 may be calibrated in order to selectively bias the gate terminal of the clamp transistor 112 by generating a current 560. For example, by programming the programmable current source 304 and the programmable resistor 416, a particular value of the current 560 may be provided. The current 560 may bias the diode device 208, which may bias the gate terminal 218 of the clamp transistor 112. Because the trigger voltage level of the snapback clamp circuit 110 is related to a gate-to-source voltage of the clamp transistor 112, controlling the programmable current source 304 and the programmable resistance 416 may enable further control of snapback operation of the snapback clamp circuit 110.

Figure 6:
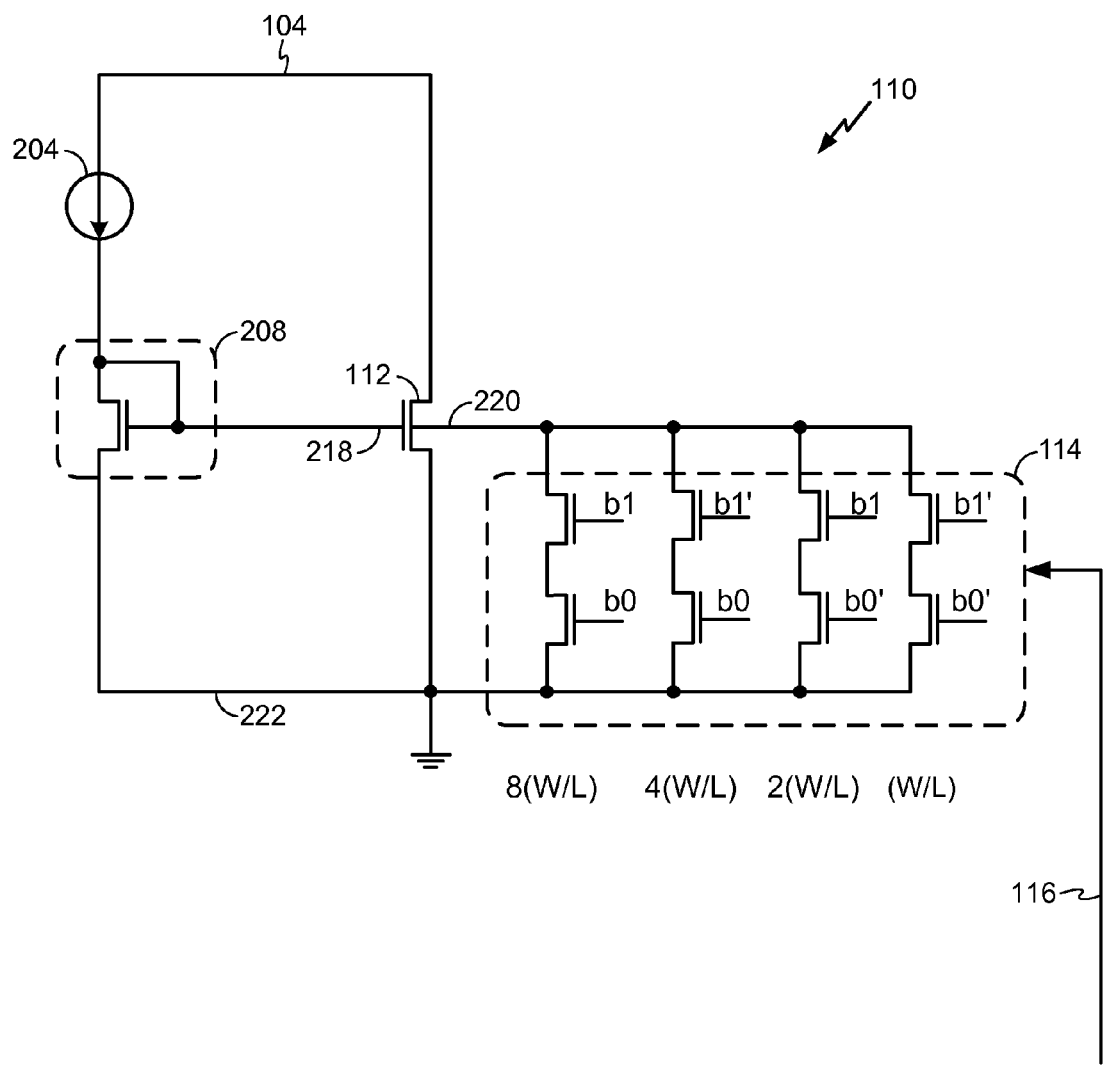
FIG. 6 is a diagram of another particular illustrative embodiment of the snapback clamp circuit of FIG. 1.

FIG. 6 depicts another particular illustrative embodiment of the snapback clamp circuit 110 of FIG. 1. Certain components and operations of the snapback clamp circuit 110 of FIG. 6 may be described as with reference to FIGS. 1-5. For example, the snapback clamp circuit 110 of FIG. 5 is responsive to the supply voltage 104 and includes the clamp transistor 112, the diode device 208, the current source 204, the ground node 222, and the programmable resistance portion 114 responsive to the control signal 116. The clamp transistor 112 includes the gate terminal 218 and the body terminal 220.

As shown in FIG. 6, the programmable resistance portion 114 of FIG. 6 includes a plurality of transistors. In the particular example of FIG. 6, the plurality of transistors includes four pairs of transistors, and each of the pairs of transistors is activated by particular corresponding values of the control signal 116. In a particular embodiment, the control signal 116 includes a multi-bit code (e.g., a digital code). For example, the control signal 116 may be a two-bit code having a first bit b0 and a second bit b1.

A first pair of transistors may be activated by the first bit value b0 and the second bit value b1 each having a logically high value. A second pair of transistors may be activated by the first bit value b0 having a logically high value and the second bit value b1 having a logically low value (i.e., a complement of the second bit value b1 having a logically high value). Further, a third pair of transistors may be activated by the complement of the first bit value b0 having a logically high value and the second bit value b1 having a logically high value. As shown in FIG. 6, a fourth pair of transistors may be activated when the complement of the first bit value b0 and the complement of the second bit value b1 each have a logically high value. Accordingly, in at least one embodiment, a particular combination of bit values of the control signal 116 activates a corresponding subset of a plurality of transistors of the programmable resistance portion 114. Although the particular example of FIG. 6 depicts four pairs of transistors, it should be appreciated that FIG. 6 is illustrative and that other configurations are within the scope of the disclosure.

In addition, in the particular example of FIG. 6, each of the pairs of transistors is associated with a respective width-to-length (W/L) ratio. For example, in the particular embodiment of FIG. 6, the first pair of transistors is associated with a respective width-to-length ratio that is approximately eight times a width-to-length ratio associated with the fourth pair of transistors. As another example, the second pair of transistors is associated with a respective width-to-length ratio that is approximately twice a respective width-to-length ratio associated with the third pair of transistors and that is approximately four times the respective width-to-length ratio of the fourth pair of transistors. Although the particular example of FIG. 6 depicts particular width-to-length ratios, it should be appreciated that FIG. 6 is illustrative and other configurations are within the scope of the disclosure.

In operation, a particular value of the control signal 116 may activate a particular pair of transistors of the programmable resistance portion 114 to achieve a particular resistance between the body terminal 220 and the ground node 222. For example, because the first pair of transistors has a greater width-to-length ratio than the second pair of transistors, the first pair of transistors may be associated with a first resistance that is greater than a second resistance associated with the second pair of transistors. Selecting the first pair of transistors may therefore enable greater current to flow from the body terminal 220 of the clamp transistor 112 to the ground node 222 as compared to selection of the second pair of transistors. Accordingly, a body-to-ground resistance associated with the clamp transistor 112 may be controlled via the programmable resistance portion 114 and via the control signal 116. Accordingly, a trigger voltage level associated with snapback operation of the snapback clamp circuit 110 may be calibrated using the control signal 116.

Figure 7:
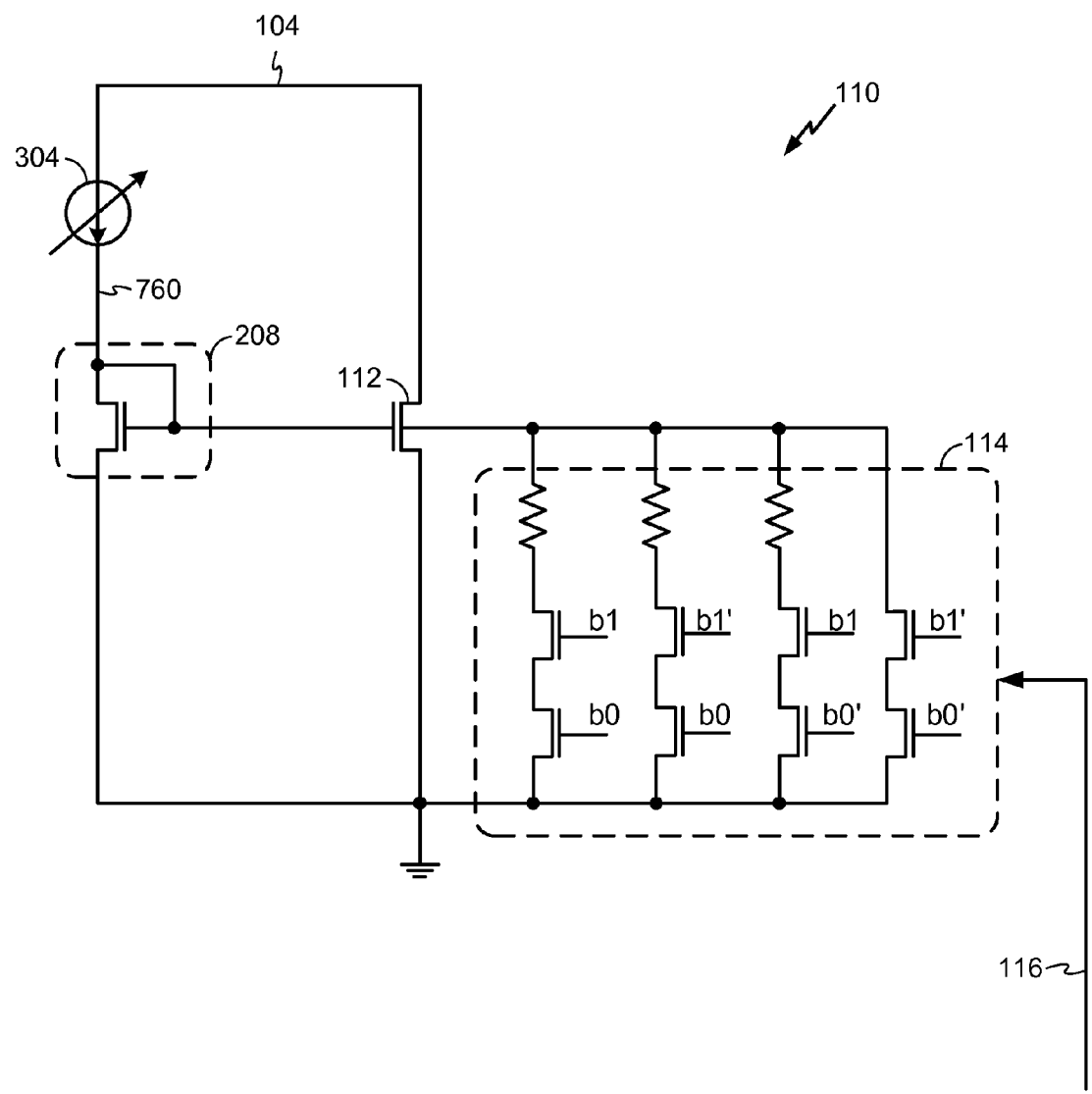
FIG. 7 is a diagram of another particular illustrative embodiment of the snapback clamp circuit of FIG. 1.

FIG. 7 depicts another particular illustrative embodiment of the snapback clamp circuit 110 of FIG. 1. Certain components and operations of the snapback clamp circuit 110 of FIG. 7 may be as described with reference to FIGS. 1-6. For example, the snapback clamp circuit 110 of FIG. 7 is responsive to the supply voltage 104 and includes the clamp transistor 112 and the programmable resistance portion responsive to the control signal 116. In addition, in the particular example of FIG. 7, the snapback clamp circuit 110 includes a programmable bias device that includes the programmable current source 304.

Further, in the example of FIG. 7, the programmable resistance portion 114 includes three resistors each corresponding to a respective pair of transistors. Operation of the transistors of the programmable resistance portion 114 may be as described with reference to FIG. 6. In addition, depending on the particular application, the resistors of the programmable resistance portion 114 of FIG. 7 may enable programming of a greater body-to-ground resistance as compared to the programmable resistance portion 114 of FIG. 6, which as illustrated does not include resistors. Further, the programmable resistance portion 114 of FIG. 7 includes a "low resistance" path. Operation of the "low resistance" path may be generally as described with reference to FIG. 2.

In operation, the programmable bias device (e.g., the programmable current source 304) may be programmed to determine or adjust a current 760. The current 760 may bias the diode device 208, which may determine a gate-to-source voltage associated with the clamp transistor 112, thus enabling calibration of snapback operation associated with the snapback clamp circuit 110. Although FIG. 7 depicts that the programmable bias device includes the programmable current source 304, according to further embodiments, the programmable bias device may include a "fixed" current source, a programmable resistor, a resistor having a "fixed" resistance, or a combination thereof. The programmable resistance portion 114 may be programmed to further adjust the trigger voltage level (e.g., by selecting one or more of the pairs of transistors to enable a particular body-to-ground resistance of the clamp transistor 112).

Figure 8:
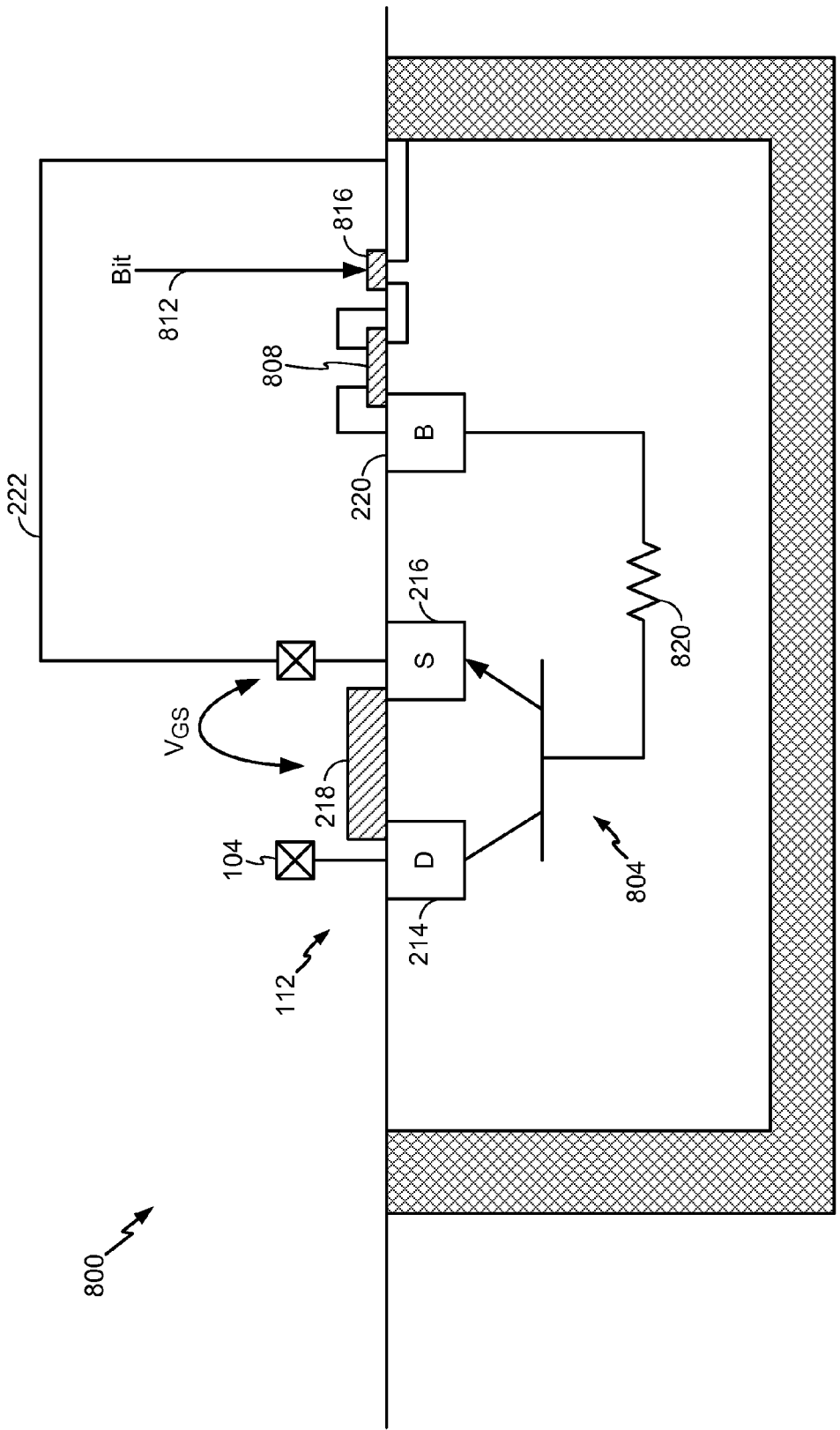
FIG. 8 is a diagram of a particular illustrative embodiment of portion of the snapback clamp circuit of FIG. 1.

Referring to FIG. 8, a particular illustrative embodiment of a portion (e.g., cross-section) of the snapback clamp 110 of FIG. 1 is depicted and generally designated 800. Certain components and operations of the clamp transistor 112 as illustrated in FIG. 8 may be as described with reference to FIGS. 1-7. For example, the portion 800 of the snapback clamp circuit 110 includes the clamp transistor 112 and the ground node 222. The clamp transistor 112 includes the drain terminal 214, the source terminal 216, the gate terminal 218, and the body terminal 220. The drain terminal 214 is responsive to the supply voltage 104. The source terminal 216 is coupled to the ground node 222.

In the example of FIG. 8, the portion 800 of the snapback clamp circuit 110 includes a resistor 808 (e.g., a polysilicon resistor) and a switch 816 (e.g., a transistor). The resistor 808 is coupled to the body terminal 220 and may be selectively coupled to the ground node 222 when a bit 812 (e.g., a logically high value or a logically low value) is asserted (e.g., is the logically high value) and activates the switch 816, as described further below. In at least one embodiment, the resistor 808 corresponds to a resistor of the programmable resistance portion 114, such as a resistor of the plurality of resistors described with reference to FIG. 2. The bit 812 may correspond to the control signal 116 or to a particular bit value of the control signal 116 (e.g., the first bit value b0 or the second bit value b1).

In operation, the clamp transistor 112 may enter a snapback clamping mode of operation in response to a gate-to-source voltage between the gate terminal 218 and the source terminal 216 reaching a trigger voltage level associated with the clamp transistor 112. That is, the clamp transistor 112 may begin parasitic bipolar operation (illustratively depicted in FIG. 8 as a parasitic bipolar junction transistor (BJT) 804) when the gate-to-source voltage reaches the trigger voltage level. Parasitic bipolar operation of the clamp transistor 112 is also referred to herein as a "parasitic bipolar junction transistor (BJT) effect."

When the bit 812 is asserted, the body terminal 220 is coupled to the ground node 222 via the resistor 808 (e.g., by activating the switch 816). Accordingly, during parasitic bipolar operation, the body terminal 220 may discharge current to the ground node 222 when the bit 812 is asserted. The amount of current discharged via the body terminal 220 to the ground node 222 may be calibrated by a resistance value of the resistor 808 (i.e., the trigger voltage level of the clamp transistor 112 may be adjusted based on assertion of the bit 812).

The amount of current discharged via the body terminal 220 may be affected by one or more process variations associated with an integrated circuit that includes the portion 800 of the snapback clamp circuit 110. For example, a substrate resistivity (illustratively depicted in FIG. 8 as a substrate resistivity 820) associated with the integrated circuit may deviate from a design specification of the integrated circuit. As illustratively depicted in FIG. 8, the substrate resistivity 820 may affect the body-to-ground resistance of the clamp transistor 112 and may therefore cause the trigger voltage level and operation of the clamp transistor 112 to deviate from the design specification, potentially causing susceptibility of the integrated circuit to supply glitches, ESD events, or a combination thereof. By selectively activating the switch 816 based on the bit 812, the body-to-ground resistance (and the trigger voltage level) of the clamp transistor 112 can be adjusted to compensate for process variations, such as the substrate resistivity 820 deviating from the design specification. As will be appreciated, other calibration techniques described herein may also be used to adjust the trigger voltage level to compensate for such process variations.

Although the particular example of FIG. 8 depicts the body terminal 220 coupled to a single resistor (i.e., the resistor 808), it should be appreciated that the body terminal 220 may be coupled to one or more additional resistors, to one or more transistors (e.g., as described with reference to FIGS. 6 and 7), or a combination thereof. Any of the one or more resistors and/or the one or more transistors may be responsive to the bit 812, to one or more additional bits not shown in FIG. 8, to the control signal 116, to another signal, or a combination thereof.

By selecting a particular resistance of the resistor 808, biasing the gate terminal 218 using a programmable bias device, and/or asserting the bit 812 (e.g., via the control signal 116), clamping operation of the clamp transistor 112 may be calibrated. The clamping operation may be calibrated to account for electrostatic discharge (ESD) events, as well as trace inductances associated with the supply voltage 104 that are known only after fabrication of the portion 800 of the snapback clamp circuit 110 (e.g., after fabrication of an integrated circuit that includes the portion 800 of the snapback clamp circuit 110).

Figure 9:
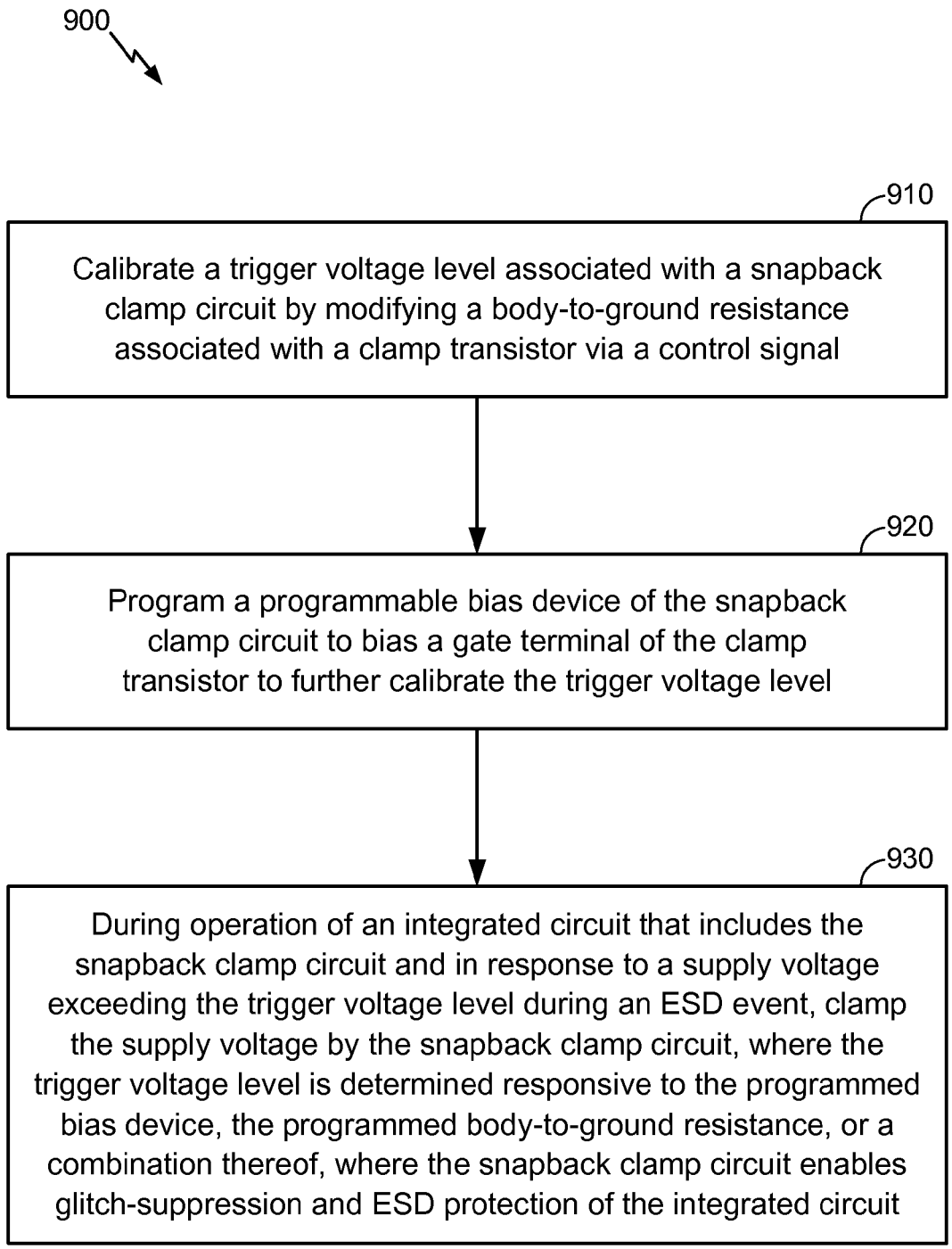
FIG. 9 is a flow chart of a particular illustrative embodiment of a method of calibrating and operating a snapback clamp circuit.

Referring to FIG. 9, a particular illustrative embodiment of a method is depicted and generally designated 900. The method 900 may be performed at or by any of the particular embodiments of the snapback clamp circuit 110 described with reference to FIGS. 1-7, at the portion 800 of the snapback clamp circuit 110 described with reference to FIG. 8, or a combination thereof.

The method 900 includes calibrating a trigger voltage level associated with the snapback clamp circuit 110 by modifying a body-to-ground resistance associated with a clamp transistor via a control signal, at 910. The clamp transistor may correspond to the clamp transistor 112. The control signal may correspond to the control signal 116, the bit 812, or a combination thereof.

The method 900 further includes programming a programmable bias device of the snapback clamp circuit 110 to bias a gate terminal of the clamp transistor (e.g., via a diode device, such as the diode device 208) to further calibrate the trigger voltage level, at 920. The gate terminal may correspond to the gate terminal 218. The programmable bias device may include the programmable current source 304, the programmable resistor 416, or a combination thereof.

The method 900 further includes, during operation of an integrated circuit that includes the snapback clamp circuit 110 and in response to a supply voltage exceeding the trigger voltage level during an electrostatic discharge (ESD) event, clamping the supply voltage by the snapback clamp circuit 110, at 930. The trigger voltage level is determined responsive to the programmed bias device, the programmed body-to-ground resistance, or a combination thereof. The snapback clamp circuit enables glitch suppression (e.g., suppression of glitches associated with the supply voltage 104, as described with reference to FIG. 1) and ESD protection of the integrated circuit.

Clamping the supply voltage in response to the supply voltage exceeding the trigger voltage level may enable glitch suppression and electrostatic discharge (ESD) protection of the integrated circuit. For example, referring again to FIG. 1, in response to a glitch in the supply voltage 104, such as when the trace inductance 128 outputs a voltage, the snapback clamp circuit 110 may enter a snapback mode of operation to suppress the supply glitch associated with the supply voltage 104. The trigger voltage level may be calibrated based at least in part on any of the trace inductances 118, 120, 128, 132.

Figure 10:
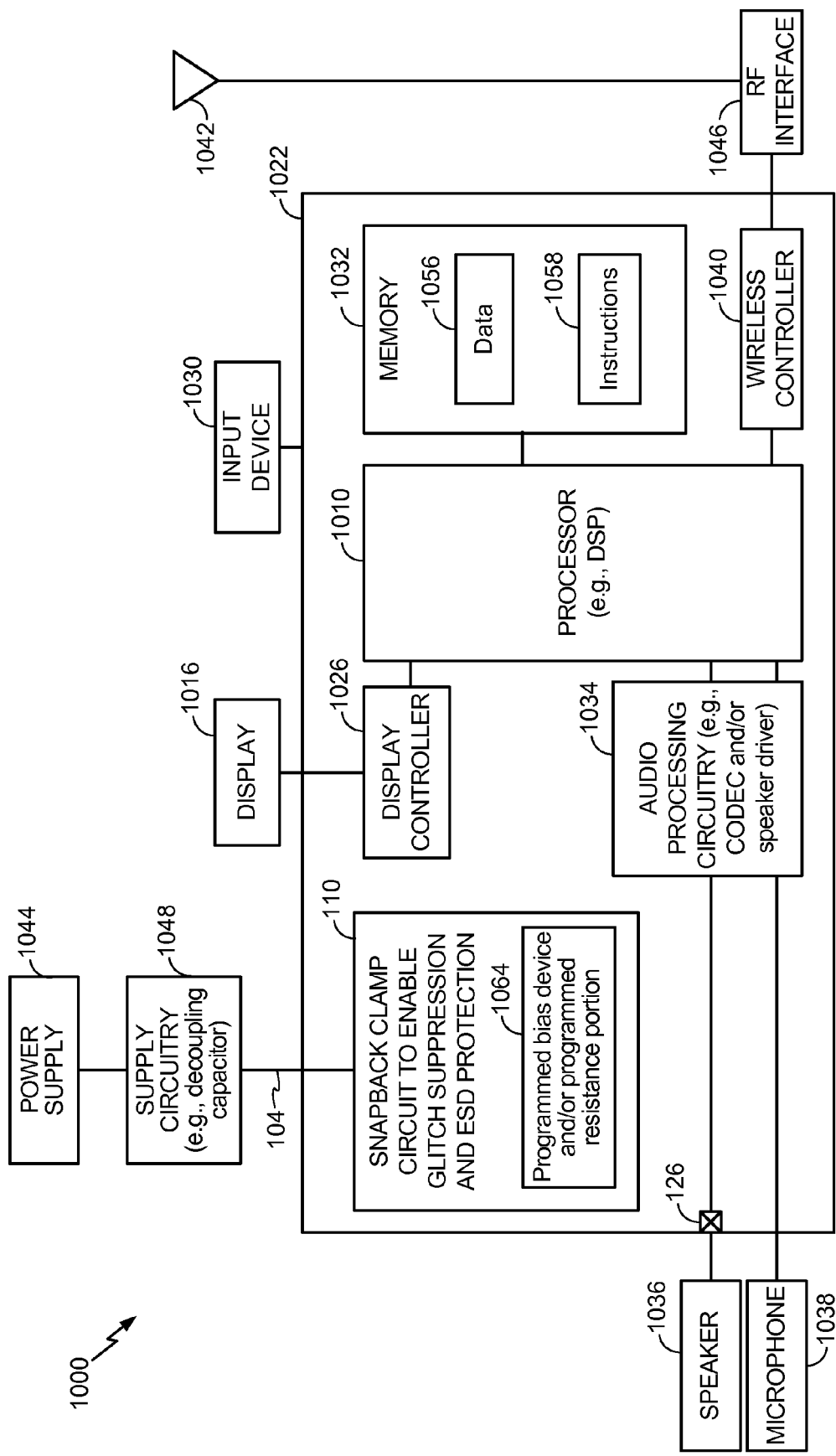
FIG. 10 is a block diagram of communication device including a snapback clamp circuit.

Referring to FIG. 10, a block diagram of a particular illustrative embodiment of a communication device is depicted and generally designated 1000. In the example of FIG. 10, the communication device 1000 includes the snapback clamp circuit 110. The snapback clamp circuit 110 of FIG. 10 includes a programmed bias device, a programmed resistance portion, or a combination thereof, which are generally designated 1064. The programmed bias device may correspond to one or more of the programmable current source 304 after programming, the programmable resistor 416 after programming, or a combination thereof. The programmed resistance portion may correspond to the programmable resistance portion 114 after programming, the resistor 808 when the bit 812 is asserted, or a combination thereof. The snapback clamp circuit 110 may be coupled to any of the components of the communication device 1000. For example, one or more of the components of the communication device 1000 may be coupled to the snapback clamp circuit 110 and may correspond to the load 124 of FIG. 1.

The snapback clamp circuit 110 of FIG. 10 is responsive to the supply voltage 104. The supply voltage 104 may be generated by a power supply 1044 coupled to supply circuitry 1048. The supply circuitry 1048 may include the decoupling capacitor 140 of FIG. 1. The power supply 1044 and the supply circuitry 1048 may correspond to the off-chip portion 152 of FIG. 1.

The communication device 1000 may include a processor 1010, such as a digital signal processor (DSP). The processor 1010 may be coupled to a memory 1032 (e.g., a non-transitory computer-readable medium). The memory 1032 may store instructions 1058 executable by the processor 1010. The memory 1032 may store data 1056 accessible to the processor 1010.

FIG. 10 also shows a display controller 1026 that is coupled to the processor 1010 and to a display 1016. Audio processing circuitry 1034, such as a coder/decoder (CODEC) and/or a speaker driver (e.g., a class-D speaker driver, which may correspond to the load 124 of FIG. 1), can also be coupled to the processor 1010. A speaker 1036 and a microphone 1038 can be coupled to the audio processing circuitry 1034. FIG. 10 also indicates that a wireless controller 1040 can be coupled to the processor 1010 and can be further coupled to an antenna 1042 via a radio frequency (RF) interface 1046 (e.g., a transceiver).

In a particular embodiment, the snapback clamp circuit 110, the processor 1010, the display controller 1026, the memory 1032, the audio processing circuitry 1034, and the wireless controller 1040 are included in an integrated circuit, such as a system-in-package or system-on-chip device 1022, which may correspond to the integrated circuit described with reference to FIG. 9. In the example of FIG. 10, the snapback clamp circuit 110 enables glitch suppression (e.g., suppression of glitches associated with the power supply 1044, such as glitches caused by trace inductances associated with the power supply 1044) and ESD protection of the system-on-chip device 1022.

An input device 1030 may be coupled to the system-on-chip device 1022. Moreover, in a particular embodiment, and as illustrated in FIG. 10, the display 1016, the input device 1030, the speaker 1036, the microphone 1038, the antenna 1042, the supply circuitry 1048, the RF interface 1046, and the power supply 1044 are external to the system-on-chip device 1022. However, each of the display 1016, the input device 1030, the speaker 1036, the microphone 1038, the antenna 1042, the supply circuitry 1048, the RF interface 1046, and the power supply 1044 can be coupled to a component of the system-on-chip device 1022, such as to an interface or to a controller. As a particular example, FIG. 10 depicts that the speaker 1036 may be coupled to the audio processing circuitry 1034 via the I/O component 126 of FIG. 1. Further, the snapback clamp circuit 110 of FIG. 10 may be calibrated via the control signal 116, which may be asserted via another I/O component (e.g., pin). For example, the control signal 116 may be asserted once (e.g., during manufacturing of the communication device 1000) to program the snapback clamp circuit 110. In a particular embodiment, switches, transistors, and/or programmable devices described herein may include one-time programmable (OTP) logic that can be calibrated a single time. Alternatively, the control signal 116 may be asserted during operation of the communication device 1000. For example, during device operation, the processor 1010 may access the data 1056, the instructions 1058, or a combination thereof, to generate the control signal 116 to program (e.g., activate, deactivate, or calibrate) switches, transistors, and/or programmable devices of the snapback clamp circuit 110.

In conjunction with the described embodiments, an apparatus is disclosed that includes means for clamping (e.g., the clamp transistor 112) a supply voltage (e.g., the supply voltage 104) based on a trigger voltage level. The apparatus further includes means for calibrating the trigger voltage level. The means for calibrating the trigger voltage level includes means for biasing (e.g., the programmable current source 304, the programmable resistor 416, or a combination thereof) an input node (e.g., the gate terminal 218) of the means for clamping the supply voltage. The means for calibrating the trigger voltage level further includes means for modifying (e.g., the programmable resistance portion 114, the resistor 808 when the bit 812 is asserted, or a combination thereof) a body-to-ground resistance associated with the means for clamping the supply voltage.

The foregoing disclosed devices and functionalities may be designed and configured into computer files (e.g. RTL, GDSII, GERBER, etc.) stored on computer-readable media. Some or all such files may be provided to fabrication handlers to fabricate devices based on such files. Resulting products include semiconductor wafers that are then cut into semiconductor dies and packaged into semiconductor chips. Such semiconductor chips may be communicatively coupled, such as using a printed circuit board (PCB), to form a printed circuit assembly (PCA). The PCA may be integrated within an electronic device, such as a wireless telephone.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:
   a snapback clamp circuit configured to clamp a supply voltage in response to the supply voltage exceeding a trigger voltage level,
   wherein the snapback clamp circuit includes a clamp transistor and a programmable resistance portion configured to adjust a body-to-ground resistance of the clamp transistor and responsive to a control signal to calibrate the trigger voltage level.

2. The device of claim 1, wherein the programmable resistance portion is coupled to a body terminal of the clamp transistor.

3. The device of claim 2, wherein the programmable resistance portion includes a plurality of resistors each coupled to the body terminal of the clamp transistor.

4. The device of claim 3, wherein a first resistor of the plurality of resistors is further coupled to a first switch and a second resistor of the plurality of resistors is further coupled to a second switch.

5. The device of claim 4, wherein the control signal is a multi-bit code, wherein the first switch includes a first transistor gated by a first bit value of the multi-bit code and further includes a second transistor gated by a second bit value of the multi-bit code, and wherein the second switch includes a third transistor gated by a complement of the first bit value, a fourth transistor gated by a complement of the second bit value, or a combination thereof.

6. The device of claim 4, wherein the programmable resistance portion further includes a low-resistance path coupled to a third switch.

7. The device of claim 1, wherein the programmable resistance portion includes a first transistor having a first width-to-length ratio and further includes a second transistor having a second width-to-length ratio, and wherein the second width-to-length ratio is greater than the first width-to-length ratio.

8. The device of claim 7, wherein the programmable resistance portion has a first resistance when the first transistor is activated by a first bit value of the control signal, and wherein the programmable resistance portion has a second resistance when the second transistor is activated by a complement of the first bit value, the first resistance greater than the second resistance.

9. The device of claim 7, wherein the second width-to-length ratio is approximately twice the first width-to-length ratio.

10. The device of claim 1, wherein the programmable resistance portion includes at least one polysilicon resistor coupled to a body terminal of the clamp transistor.

11. The device of claim 1, wherein the trigger voltage level is programmed based on a trace inductance associated with circuitry that provides the supply voltage.

12. The device of claim 1, wherein the trigger voltage level is associated with a parasitic bipolar junction transistor (BJT) effect associated with the snapback clamp circuit.

13. The device of claim 1, further comprising a programmable bias device configured to further calibrate the trigger voltage level by biasing a gate terminal of the clamp transistor.

14. The device of claim 13, wherein the trigger voltage level is determined further based on a gate-to-source voltage of the clamp transistor biased by the programmable bias device.

15. The device of claim 13, wherein the programmable bias device includes a programmable current source coupled to a diode device.

16. The device of claim 13, wherein the programmable bias device includes a programmable resistance coupled to a current source.

17. The device of claim 13, wherein the programmable bias device includes a programmable current source and a diode device, and wherein the diode device is coupled to a resistor.

18. The device of claim 13, wherein the programmable bias device includes a programmable current source and a programmable resistance.

19. A device comprising:
   a snapback clamp circuit configured to clamp a supply voltage in response to the supply voltage exceeding a trigger voltage level,
   wherein the snapback clamp circuit includes a clamp transistor and a programmable bias device configured to calibrate the trigger voltage level by biasing a gate terminal of the clamp transistor and wherein the trigger voltage level is determined based on a gate-to-source voltage of the clamp transistor biased by the programmable bias device.

20. The device of claim 19, wherein the programmable bias device includes a programmable current source coupled to a diode device.

21. The device of claim 19, wherein the programmable bias device includes a programmable resistance coupled to a current source.

22. The device of claim 19, wherein the programmable bias device includes a programmable current source coupled to a resistor.

23. The device of claim 19, wherein the programmable bias device includes a programmable current source and a programmable resistance.

24. The device of claim 19, wherein the snapback clamp circuit further includes a programmable resistance portion configured to further calibrate the trigger voltage level, the programmable resistance portion coupled to a body terminal of the clamp transistor.

25. The device of claim 24, wherein the programmable resistance portion further includes a low-resistance path coupled to a third switch.

26. The device of claim 24, wherein the programmable resistance portion includes at least one polysilicon resistor coupled to the body terminal of the clamp transistor.

27. The device of claim 24, wherein the programmable resistance portion includes a first transistor having a first width-to-length ratio and further includes a second transistor having a second width-to-length ratio, and wherein the second width-to-length ratio is greater than the first width-to-length ratio.

28. The device of claim 27, wherein the programmable resistance portion is associated with a first resistance when the first transistor is gated by a first bit value, and wherein the programmable resistance portion is associated with a second resistance when the second transistor is gated by a complement of the first bit value, and wherein the first resistance is greater than the second resistance.

29. The device of claim 27, wherein the second width-to-length ratio is approximately twice the first width-to-length ratio.

30. The device of claim 24, wherein the programmable resistance portion includes a plurality of resistors each coupled to the body terminal of the clamp transistor.

31. The device of claim 30, wherein a first resistor of the plurality of resistors is further coupled to a first switch and a second resistor of the plurality of resistors is further coupled to a second switch.

32. The device of claim 31, wherein the first switch includes a first transistor gated by a first bit value of a multi-bit code and further includes a second transistor gated by a second bit value of the multi-bit code, and wherein the second switch includes a third transistor gated by a complement of the first bit value, a fourth transistor gated by a complement of the second bit value, or a combination thereof.

33. The device of claim 19, wherein the trigger voltage level is programmed based on a trace inductance associated with circuitry that provides the supply voltage.

34. The device of claim 19, wherein the trigger voltage level is associated with a parasitic bipolar junction transistor (BJT) effect associated with the snapback clamp circuit.

35. The device of claim 19, further comprising a programmable resistance portion configured to adjust a body-to-ground resistance of the clamp transistor to calibrate the trigger voltage level.

36. A method of calibrating a snapback clamp circuit, the method comprising:
calibrating a trigger voltage level associated with a snapback clamp circuit by modifying a body-to-ground resistance associated with a clamp transistor via a control signal; and
programming a programmable bias device of the snapback clamp circuit to bias a gate terminal of the clamp transistor to further calibrate the trigger voltage level.

37. The method of claim 36, wherein modifying the body-to-ground resistance includes gating a plurality of transistors based on the control signal.

38. The method of claim 36, further comprising biasing the gate terminal of the clamp transistor by biasing a diode device with a programmable current source.

39. The method of claim 36, wherein the trigger voltage level is calibrated after coupling the snapback clamp circuit to a supply voltage.

40. An apparatus comprising:
means for clamping a supply voltage based on a trigger voltage level; and
means for calibrating the trigger voltage level, wherein the means for calibrating the trigger voltage level comprises:
means for biasing an input node of the means for clamping the supply voltage; and
means for modifying a body-to-ground resistance associated with the means for clamping the supply voltage.

41. The apparatus of claim 40, wherein the means for clamping the supply voltage comprises a clamp transistor, and wherein the input node comprises a gate terminal of the clamp transistor.

42. A non-transitory computer-readable medium storing instructions executable by a processor to calibrate a trigger voltage level of a snapback clamp circuit by generating a control signal to calibrate a programmable resistance portion of the snapback clamp circuit, wherein the snapback clamp circuit comprises a clamp transistor and wherein the programmable resistance portion is configured to adjust a body-to-ground resistance of the clamp transistor.

43. The non-transitory computer-readable medium of claim 42, wherein the control signal is a multi-bit code, wherein a first combination of bit values of the multi-bit code activates a first subset of a plurality of transistors of the programmable resistance portion, and wherein a second combination of bit values of the multi-bit code activates a second subset of the plurality of transistors.

44. An integrated circuit comprising:
a snapback clamp circuit having a trigger voltage level determined based on a programmed bias device of the snapback clamp circuit, a programmed body-to-ground resistance of the snapback clamp circuit, or a combination thereof,
wherein the snapback clamp circuit is configured to clamp a supply voltage in response to the supply voltage exceeding the trigger voltage level during an electrostatic discharge (ESD) event, and
wherein the snapback clamp circuit enables glitch-suppression and ESD protection of the integrated circuit.

45. The integrated circuit of claim 44, wherein the trigger voltage level is associated with a parasitic bipolar junction transistor (BJT) effect of a clamp transistor of the snapback clamp circuit.

46. A method of clamping a supply voltage during operation of an integrated circuit, the method comprising:

in response to the supply voltage exceeding a trigger voltage level during an electrostatic discharge (ESD) event, clamping the supply voltage by a snapback clamp circuit of the integrated circuit, wherein the trigger voltage level is determined responsive to a programmed bias device of the snapback clamp circuit, a programmed body-to-ground resistance of the snapback clamp circuit, or a combination thereof, and wherein the snapback clamp circuit enables glitch-suppression and ESD protection of the integrated circuit.

47. The method of claim 46, wherein the trigger voltage level is associated with a parasitic bipolar junction transistor (BJT) effect of a clamp transistor of the snapback clamp circuit.

* * * * *